(12) United States Patent
Kuwazawa

(10) Patent No.: US 7,488,997 B2
(45) Date of Patent: Feb. 10, 2009

(54) SOLID-STATE IMAGING DEVICE AND METHOD FOR DRIVING THE SAME

(75) Inventor: Kazunobu Kuwazawa, Nagano (JP)

(73) Assignee: Seiko Epson Corporation (JP)

( * ) Notice: Subject to any disclaimer, the term of this patent is extended or adjusted under 35 U.S.C. 154(b) by 616 days.

(21) Appl. No.: 11/181,586

(22) Filed: Jul. 14, 2005

(65) Prior Publication Data

US 2006/0028567 A1 Feb. 9, 2006

(30) Foreign Application Priority Data

Aug. 9, 2004 (JP) ............................. 2004-231909

(51) Int. Cl.
  *H01L 27/148* (2006.01)
  *H01L 29/768* (2006.01)
  *H01L 31/062* (2006.01)
  *H01L 31/113* (2006.01)

(52) U.S. Cl. ...................................... 257/233; 257/292

(58) Field of Classification Search ......... 257/225–234, 257/290–294
See application file for complete search history.

(56) References Cited

U.S. PATENT DOCUMENTS

| | | | |
|---|---|---|---|
| 7,253,461 B2 * | 8/2007 | Yang et al. ................... | 257/292 |
| 7,271,430 B2 * | 9/2007 | Park et al. .................... | 257/292 |
| 7,307,300 B2 * | 12/2007 | Inoue ......................... | 257/291 |
| 7,342,271 B2 * | 3/2008 | Park et al. .................... | 257/292 |
| 2006/0001061 A1 * | 1/2006 | Miyatake et al. ............. | 257/292 |
| 2006/0060897 A1 * | 3/2006 | Kuwazawa ................... | 257/292 |
| 2006/0249766 A1 * | 11/2006 | Rhodes ....................... | 257/292 |

FOREIGN PATENT DOCUMENTS

| | | |
|---|---|---|
| JP | 2002-134729 | 5/2002 |
| JP | 2002-368201 | 12/2002 |
| JP | 2004-087963 | 3/2004 |

* cited by examiner

*Primary Examiner*—Cuong Q Nguyen
(74) *Attorney, Agent, or Firm*—Harness, Dickey & Pierce, P.L.C.

(57) ABSTRACT

A solid-state imaging device including a plurality of unit pixels, each of which includes: a storage well for storing electric charge generated by a photoelectric transducer using incident light; a transferring unit, which is formed on a top surface of a substrate, for transferring the electric charge to a floating diffusion region; and an amplifier for outputting a pixel signal that is amplified based on the electric charge transferred to the floating diffusion region, wherein: the transferring unit is a transfer control element having: a transfer gate that is provided on the substrate surface through an insulation film so that part of the transfer gate overlaps the storage well when the substrate is viewed from a direction orthogonal to the substrate surface; and an electric charge-retaining region for retaining the electric charge that is provided within the substrate and under the transfer gate; and further a diffusion layer that serves as a transfer path between the floating diffusion region and the electric charge-retaining region is provided under another diffusion layer of the substrate.

14 Claims, 5 Drawing Sheets

SOLID-STATE IMAGING DEVICE AND METHOD FOR DRIVING THE SAME

RELATED APPLICATIONS

This application claims priority to Japanese Patent Application No. 2004-231909 filed Aug. 9, 2004 which is hereby expressly incorporated by reference herein in its entirety.

BACKGROUND OF THE INVENTION

1. Technical Field

The invention relates to a solid-state imaging device and a method for driving the same.

2. Related Art

As solid-state imaging devices mounted in cellular phones, digital cameras, etc., there are a charge-coupled device (CCD) image sensor (hereinafter referred to as a CCD sensor) and a CMOS image sensor (hereinafter referred to as a CMOS sensor).

Further, in recent years, there has been a proposal of an MOS solid-state imaging device (hereinafter referred to as a modulation-on-substrate type sensor) that employs a threshold voltage modulation method and achieves a high image quality and a low power consumption at the same time. Such a modulation-on-substrate type sensor is disclosed as a first related art example, which will be described later.

A CCD sensor, which has a high power consumption due to a high driving voltage, achieves a correlated double sampling (CDS) function for removing noises and a so-called global electronic shutter function for taking images of rapidly moving objects with least distortion. The global electronic shutter function is a function for eliminating the distortion of images of objects by storing light-generated charge for a number of light-receiving elements that are placed two-dimensionally all at a time. Therefore, a CCD sensor generally has an advantage of excellent image quality.

On the other hand, a CMOS sensor of especially a CMOS-active pixel sensor (APS) type having a four-transistor configuration cannot achieve the global electronic shutter function but does achieve the CDS function. Further, a CMOS sensor generally has an advantage that the process cost is low with a low power consumption due to a low driving voltage. The reason why a general CMOS-APS sensor is incapable of global electronic shutter is because a CMOS-APS sensor operates in order to achieve the CDS function where noise components are read out first for each read-out line by resetting each floating diffusion, which is an electric charge-retaining region, and then signal components are read out.

Specifically, in a CMOS-APS sensor, in order to realize CDS function, each noise component is read out first by sequentially resetting transistors for transferring electric charge line by line selected, from which pixel signals are read out, and then each signal component is read out. The read-out of signal components is performed with the sequential resetting of transistors line by line selected. That is, when a rapidly moving object is imaged, the image obtained is distorted because the timing of read-out is gradually delayed from the first line to the last line.

In addition, the global electronic shutter function is technically available in a CMOS-APS sensor. In such a case, however, the transfer transistor described above is occupied for the use of the global electronic shutter function. Therefore, if the global electronic shutter function is achieved in a CMOS-APS sensor, there arises a problem that image quality is degraded due to the incapability of achieving the CDS function.

Further, in the modulation-on-substrate type sensor disclosed in the first related art example, signal components are read out first and, followed by resetting, noise components are read out. Then, the differences of the two types of signal components are outputted as pixel signals.

In the case of a modulation-on-substrate type sensor, a signal component that is read out contains a noise component that is left over after the previous reset. A noise component to be read out is the noise component that is left over after reset. However, there is no guarantee that the amount of a noise component remaining in a signal component after the previous reset is the same as the amount of a noise component remaining after the latest reset. That is, a pixel signal to be outputted only contains the previous noise component, not the latest noise component. Therefore, in the case of a modulation-on-substrate type sensor, there is a disadvantage that noises cannot be removed precisely due to the noncorrelation between the signal component and the noise component, which leads to the degradation of image quality.

Furthermore, a technique for achieving the global electronic shutter function in a modulation-on-substrate type sensor has also been proposed in a second related art example, which will be described later. In the technique according to the second related art example, all pixels are reset at a time and then pixel signals are sequentially read out line by line.

Moreover, as a method for achieving the global electronic shutter function in a CMOS-APS sensor, another solid-state imaging device that has an electric charge-retaining region under a transfer gate has been proposed in a third related art example, which will be described later.

Japanese Unexamined Patent Publication No. 2002-134729 is the first example of related art.

Japanese Unexamined Patent Publication No. 2004-87963 is the second example of related art.

Japanese Unexamined Patent Publication No. 2002-368201 is the third example of related art.

In the technique according to the second related art example, however, there still remains a problem of the incapability of precise noise removal due to the noncorrelation between the signal component and the noise component because pixel signals are read out by reading out signal components first and, followed by reset, noise components are read out second.

Further, in the proposal according to the third related art example, the transfer of electric charge between the electric charge-retaining region and the floating diffusion region via the transfer path regions between the foregoing two regions is performed by using only the potential profiles of the three regions. Therefore, a high gate voltage is required, which is not preferable in terms of power consumption. Furthermore, it is not easy to manufacture a CMOS-APS sensor having such potential profiles.

SUMMARY

An advantage of the invention is to provide a solid-state imaging device that is capable of both the CDS function and the global electronic shutter function at the same time with a low power consumption and an easy manufacturing method.

According to a first aspect of the invention, a solid-state imaging device includes a plurality of unit pixels. Each of the plurality of unit pixels includes: a storage well for storing electric charge generated by a photoelectric transducer using incident light; a transferring unit, which is formed on the top surface of a substrate, for transferring the electric charge to a floating diffusion region; and an amplifier for outputting a pixel signal that is amplified based on the electric charge transferred to the floating diffusion region. In the solid-state imaging device, the transferring unit is a transfer control element having: a transfer gate that is provided on the substrate surface through an insulation film so that part of the transfer gate overlaps the storage well when the substrate is viewed from the direction orthogonal to the substrate surface; and an electric charge-retaining region for retaining the electric charge that is provided within the substrate and under the transfer gate. Further, in the solid-state imaging device, a diffusion layer that serves as a transfer path between the floating diffusion region and the electric charge-retaining region is provided under another diffusion layer of the substrate.

With such a configuration, a solid-state imaging device that is capable of both the CDS function and the global electronic shutter function at the same time with a low power consumption and an easy manufacturing method can be achieved.

Further, it is preferable that the solid-state imaging device according to the first aspect of the invention further includes a discharging means for discharging the excess of the electric charge in the storage well.

With such a configuration, excessive electric charge can surely be discharged.

It is also preferable that, in the solid-state imaging device according to the first aspect of the invention, the amplifier includes a modulation transistor that outputs the pixel signal in accordance with the electric charge by controlling a threshold voltage of a channel using the electric charge retained in the floating diffusion region.

With such a configuration, a solid-state imaging device that is capable of both the CDS function and the global electronic shutter function at the same time, employing a modulation-on-substrate type sensor, with a low power consumption and an easy manufacturing method can be achieved.

According to a second aspect of the invention, a method for driving a solid-state imaging device includes the following five steps. A first step is a storage step for storing, for all of a plurality of unit pixels included in the solid-state imaging device at a time, light-generated charge generated by a photoelectric transducer into a storage well by controlling a potential barrier in a transfer path using a transfer control element while preventing the light-generated charge from flowing into an electric charge-retaining region at least via the transfer path. A second step is a first transfer step for transferring, for all of the plurality of unit pixels at a time, the light-generated charge stored in the storage well to the electric charge-retaining region by controlling the potential barrier in the transfer path using the transfer control element. A third step is a noise component modulation step for reading out a noise component of a floating diffusion region, without flowing the light-generated charge into the floating diffusion region, by controlling the potential barrier in the transfer path using the transfer control element. A fourth step is a second transfer step for transferring the light-generated charge stored in the electric charge-retaining region to the floating diffusion region by controlling the potential barrier in the transfer path using the transfer control element. A fifth step is a signal component modulation step for outputting a pixel signal from the floating diffusion region in accordance with the light-generated charge while retaining the light-generated charge within a modulation well, by controlling the potential barrier in the transfer path using the transfer control element. Each of the plurality of unit pixels includes: the storage well for storing the light-generated charge generated by the photoelectric transducer in accordance with incident light; the floating diffusion region to which the light-generated charge is transferred; an amplifier for outputting the pixel signal that is amplified based on the light-generated charge transferred to the floating diffusion region; and the transfer control element that controls the potential barrier in the transfer path between the storage well and the floating diffusion region and has the electric charge-retaining region for retaining the light-generated charge.

With such a configuration, a method for driving a solid-state imaging device that is capable of both the CDS function and the global electronic shutter function at the same time with a low power consumption and an easy manufacturing method can be achieved.

BRIEF DESCRIPTION OF THE DRAWINGS

The invention will be described with reference to the accompanying drawings, wherein like numbers refer to like elements, and wherein.

DESCRIPTION OF THE EMBODIMENT

An embodiment of the invention will now be described in detail with reference to the accompanying drawings.

Figure 1:
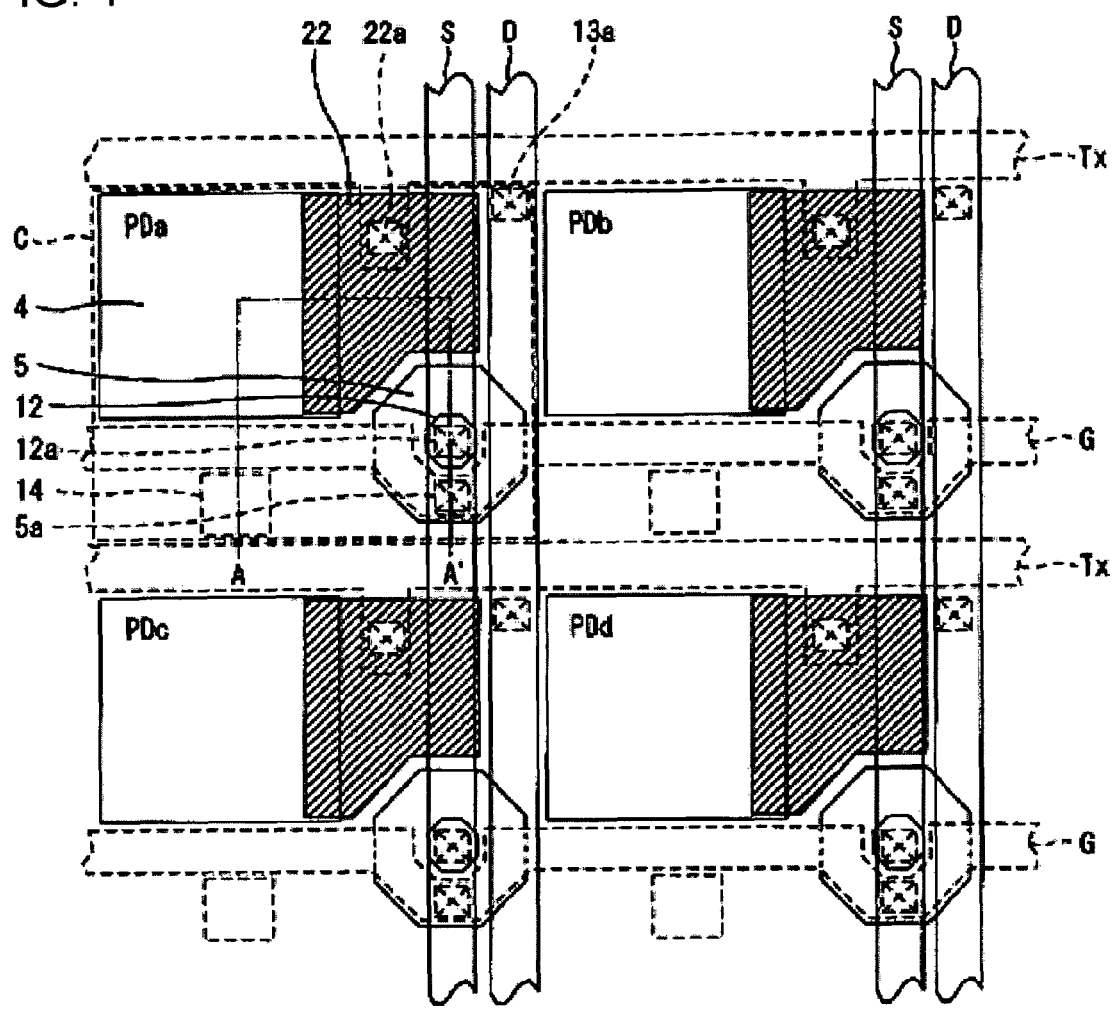
FIG. 1 is a plan view showing the plan shape of a solid-state imaging device according to an embodiment of the invention.
Figure 2:
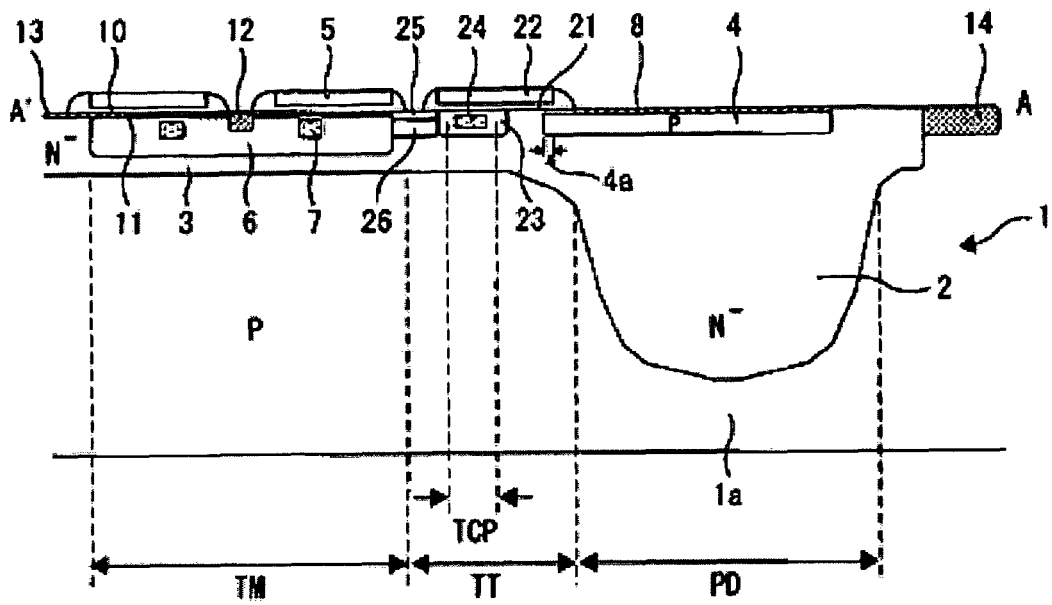
FIG. 2 is a cross section taken along the line A-A' in FIG. 1.

First, the configuration of a solid-state imaging device according to the embodiment of the invention will be described. FIG. 1 is a plan view showing the plan shape of the solid-state imaging device according to the embodiment. FIG. 2 is a cross section taken along the line A-A' in FIG. 1. However, cross sections of wiring and configurations above the wiring are not illustrated.

As shown in FIG. 1, the solid-state imaging device according to the embodiment is a sensor cell array wherein a plurality of sensor cells are placed on a substrate plane in a two-dimensional matrix. Each sensor cell stores light-generated charge generated in accordance with incident light and outputs a pixel signal of a level based on the stored light-generated charge. By placing the sensor cells in a matrix, pixel signals for a single image plane can be obtained. In FIG. 1, a region enclosed by a dotted line is a single sensor cell C, which is a unit pixel. Each sensor cell has a photodiode-forming region PD. The solid-state imaging device according to the embodiment is a modulation-on-substrate type sensor. FIG. 1 shows four of the sensor cells. Each of the four sensor cells has a photodiode-forming region PDa, PDb, PDc or PDd (each individual photodiode-forming region is hereinafter referred to as PD). Since all sensor cells has the same configuration, the following descriptions refer to the photodiode-forming region PDa. In addition, the embodiment indicates an example where a positive hole is used as light-generated charge. The solid-state imaging device can have the same configuration also in the case where an electron is used as light-generated charge.

As shown in FIG. 2, a modulation transistor-forming region TM is provided correspondingly to the photodiode-forming region PD. Further, a transfer transistor-forming region TT for transferring electric charge from the photodiode-forming region PD to the modulation transistor-forming region TM is provided between the photodiode-forming region PD and the modulation transistor-forming region TM.

In the embodiment, a carrier pocket region TCP that serves as an electric charge-retaining region for temporary retention of electric charge is provided in the transfer transistor-forming region TT. Further, in the embodiment, electric charge (light-generated charge) stored in each photodiode-forming region PD is transferred to and temporarily retained in the carrier pocket region TCP of each sensor cell for all pixels, that is, for all sensor cells at a time, and then transferred from the carrier pocket region TCP to the modulation transistor-forming region TM for each selected line.

Now, the configuration of the solid-state imaging device according to the embodiment will be described in more detail with reference to FIGS. 1 and 2. As shown in FIG. 1, the photodiode-forming region PD has an approximate rectangular shape. The photodiode-forming region PD is formed in a region enclosed by a vertical set of a source line S and a drain line D and a horizontal set of a transfer gate line TX and a gate line G on the two-dimensional matrix. The gate line G, which is linearly provided in the horizontal direction, is formed with a curve along a gate 5 (described later) having an approximate ring shape.

As shown in FIG. 2, the sensor cell is formed on a P-substrate 1a. On the P-substrate 1a within the photodiode-forming region PD, an N-well 2 having $N^-$ is formed in a deep position in the substrate. While on the P-substrate 1a within the modulation transistor-forming region TM, an N-well 3 having $N^-$ is formed in a relatively shallow position in the substrate. In addition, the signs "−" and "+" superscribed to the "N" and "P" in FIG. 2 and in the descriptions of FIG. 2 indicate the concentration of impurities in accordance with the number of signs: the smaller (−−), the thinner; and the larger (++), the thicker.

On the N-well 2 in the photodiode-forming region PD, a P-layer is formed almost covering over the photodiode-forming region PD. The P-layer functions as a storage well 4. Further on almost all over the top surface of the substrate within the photodiode-forming region PD, an $N^+$ diffusion layer 8, which functions as a pinning layer, is formed. In the photodiode-forming region PD, an opening is formed on the top surface of a substrate 1, and further the storage well 4, which is a P-well and occupies a larger region than the opening, is formed.

In a boundary region between the P-storage well 4 and the N-well 2 that is formed within the substrate 1 and in a deep position in the photodiode-forming region PD having the function of a photoelectric transducer, a depletion is formed. In the depletion, light-generated charge is generated by the incident light entered through the opening for receiving the light on the photodiode-forming region. The light-generated charge generated as above is stored in the storage well 4.

As a modulation transistor Tm that is an amplifier formed in the modulation transistor-forming region TM, an N-channel depression MOS transistor is used, for example. On the N-well 3 in the modulation transistor-forming region TM, a gate (hereinafter referred to as the ring gate or simply the gate) 5 in the shape of an approximate ring (an octagon in FIG. 1) is formed through a gate insulation film 10 on the surface of the substrate 1. Under the ring gate 5, an $N^+$ diffusion layer 11 that configures a channel is formed on the substrate surface. In the center of the opening of the ring gate 5, an $N^{++}$ diffusion layer is formed on the substrate surface, which further forms a source region (hereinafter simply referred to as the source) 12. On the N-well 3 in the modulation transistor-forming region TM, another P-layer is formed almost correspondingly to the periphery of the ring gate 5 that configures the modulation transistor. The P-layer functions as a modulation well 6. In the modulation well 6, a ring-shaped carrier pocket 7 of a highly concentrated P-region, which is a floating diffusion region based on $P^+$ diffusion, is formed along the ring shape of the ring gate 5. Further, on the substrate surface around the ring gate 5, another $N^+$ diffusion layer is formed to configure a drain region (hereinafter simply referred to as the drain) 13. The $N^+$ diffusion layer 11, which configures a channel, is coupled to the source region 12 and the drain region 13.

The modulation well 6 controls the threshold voltage of the channel of the modulation transistor Tm. The modulation transistor Tm, which is configured of the modulation well 6; the ring gate 5; the source region 12; and the drain region 13, is designed to change the threshold voltage of the channel in accordance with the electric charge stored in the carrier pocket 7.

Further, as shown in FIG. 1, a gate contact region 5a of an $N^+$ layer is formed at a specified position, near the surface of the substrate 1, in the ring gate 5. At a specified position in the source region 12, a source contact region 12a of an $N^+$ layer is formed near the surface of the substrate 1. At a specified position in the drain region 13, a drain contact region 13a of an $N^+$ layer is formed near the surface of the substrate 1.

The electric charge stored in the storage well 4 is transferred to the modulation well 6 via the transfer transistor-forming region TT, which is described later, and then retained in the carrier pocket 7. The source potential of the modulation transistor-forming region TM that functions as a modulation transistor has a correspondence with the amount of electric charge transferred to the modulation well 6, that is, the incident light entered into the photodiode-forming region PD that functions as a photodiode.

On the surface of the substrate 1 and near the storage well 4, a diffusion region (hereinafter referred to as the OFD region) 14 for discharging excessive electric charge including the overflow charge from a highly concentrated $P^{++}$ diffusion layer is formed. The OFD region 14 that functions as a discharging means for discharging the excessive electric charge in the storage well is a region for discharging, out to the substrate, the excessive electric charge (hereinafter referred to as the excessive charge) that overflowed out of the storage well 4, without being stored in the storage well 4, and does not contribute to pixel signals.

Now, the transfer transistor-forming region TT will be described. The transfer transistor-forming region TT has, within the substrate, the carrier pocket region TCP for temporarily retaining electric charge, as shown in FIG. 2.

Specifically, on the substrate surface, the transfer transistor-forming region TT is formed between the photodiode-forming region PD and the modulation transistor-forming region TM within a single sensor cell. The transfer transistor-forming region TT has a transfer gate 22 on the substrate surface through a gate insulation film 21 so that a channel is formed on the substrate surface. The channel of the transfer transistor-forming region TT, that is, a transfer path is controlled by the applied voltage of the transfer gate 22 and the voltage supplied to an $N^+$ diffusion layer 25.

Under the transfer gate 22, the carrier pocket region TCP is provided. In the carrier pocket region TCP, a P-layer is formed on the N-well 3 of the modulation transistor-forming region TM. The P-layer functions as a storage well 23 for transfer use. Within the storage well 23 for transfer use, a carrier pocket 24 for transfer use based on the P+ diffusion is formed.

Further, the transfer gate 22, which is formed on the top surface of the substrate, is provided on the substrate surface through a gate insulation film 21 so that part of the transfer gate 22 overlaps (indicated as 4a in FIG. 2) the storage well 4 when the substrate is viewed from the direction orthogonal to the substrate surface.

Furthermore, the N+ diffusion layer 25 is formed almost all over the substrate surface between the storage well 23 for transfer use and the modulation transistor-forming region TM. Under the N+ diffusion layer 25, a P-diffusion layer 26 is formed. With the N+ diffusion layer 25, the potential barrier in the transfer path 26 between the carrier pocket 24 under the transfer gate 22 and the carrier pocket 7 under the modulation transistor can be controlled effectively. At the same time, since the diffusion layer 26 can be embedded under the N+ diffusion layer 25, the N+ diffusion layer 25 fully functions as a pinning layer, which prevents the occurrence of dark current.

As shown in FIG. 1, the transfer gate 22 in the transfer transistor-forming region TT has an approximate rectangular shape, with one side coinciding with one side of the rectangle photodiode-forming region PD. In addition, in the embodiment, the ring gate 5 is provided near one corner of the photodiode-forming region PD, as shown in FIG. 1. Therefore, the transfer gate 22 of the transfer transistor-forming region TT has a shape with the part facing the ring gate 5 cut off along the shape of the ring gate.

Further, when the substrate is viewed from the direction orthogonal to the substrate surface, the carrier pocket 24 (not illustrated in FIG. 1) is formed inside the transfer gate 22 in FIG. 1.

Furthermore, as shown in FIG. 1, the gate contact region 22a of an N+ layer is formed, in the transfer gate 22, at a specified position near the surface of the substrate 1.

In addition, on the substrate surface, a wiring layer including the transfer gate line TX, the source line S, etc., which has been described earlier, is formed through an interlayer insulation film, which is not illustrated. The transfer gate 22, the source contact region 12a, etc. are electrically coupled to each wiring in the wiring layer through a contact hole provided in the interlayer insulation film. Each wiring is configured of metal materials such as aluminum, etc., for example.

Figure 3:
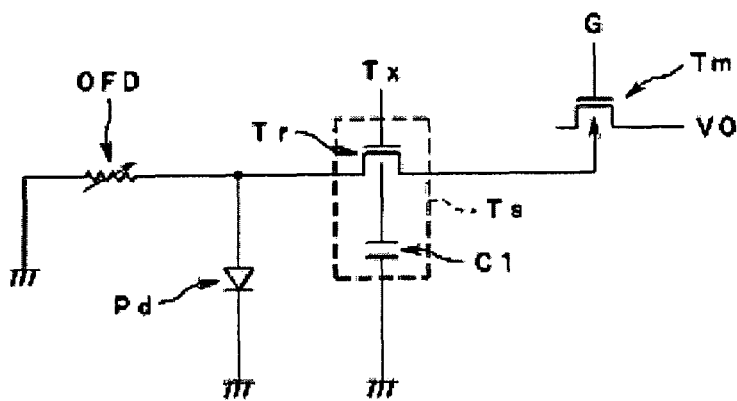
FIG. 3 is an equivalent circuit of a sensor cell in the solid-state imaging device according to the embodiment of the invention.

FIG. 3 is an equivalent circuit of a sensor cell included in the solid-state imaging device according to the embodiment. A sensor cell C is configured of a photodiode Pd that is achieved in the photodiode-forming region PD, a modulation transistor Tm that is achieved in the modulation transistor-forming region TM, and a transfer and storage unit Ts that is achieved in the transfer transistor-forming region TT. The transfer and storage unit Ts is configured of a transistor Tr that is a transfer control element formed in the region TT and a capacitor C1 that is provided under the transistor Tr. The capacitor C1 corresponds to the electric charge-retaining region that corresponds to the carrier pocket 24 described above.

The electric charge (light-generated charge) generated by the photodiode Pd that conducts photoelectric conversion is temporarily retained in the capacitor C1 by controlling the transfer gate 22 of the transistor Tr to be at a specified first voltage. Then, by controlling the transfer gate 22 of the transistor Tr to be at a specified second voltage, the electric charge retained in the capacitor C1 is transferred to the carrier pocket 7 of the modulation transistor Tm.

With the retention of electric charge in the carrier pocket 7, the modulation transistor Tm becomes an equivalent condition to the case where a backgate bias is changed, and the threshold voltage of the channel is changed in accordance with the amount of electric charge in the carrier pocket 7. Thus, an output voltage VO of the modulation transistor Tm becomes the level corresponding to the electric charge in the carrier pocket 7, that is, the brightness of the incident light entered into the photodiode Pd.

Further, in FIG. 3, a variable resistor OFD, which is coupled to one end of the photodiode Pd, is shown. An OFD region 14, which changes potential in accordance with the potential given, is indicated as the variable resistor OFD.

Figure 4:
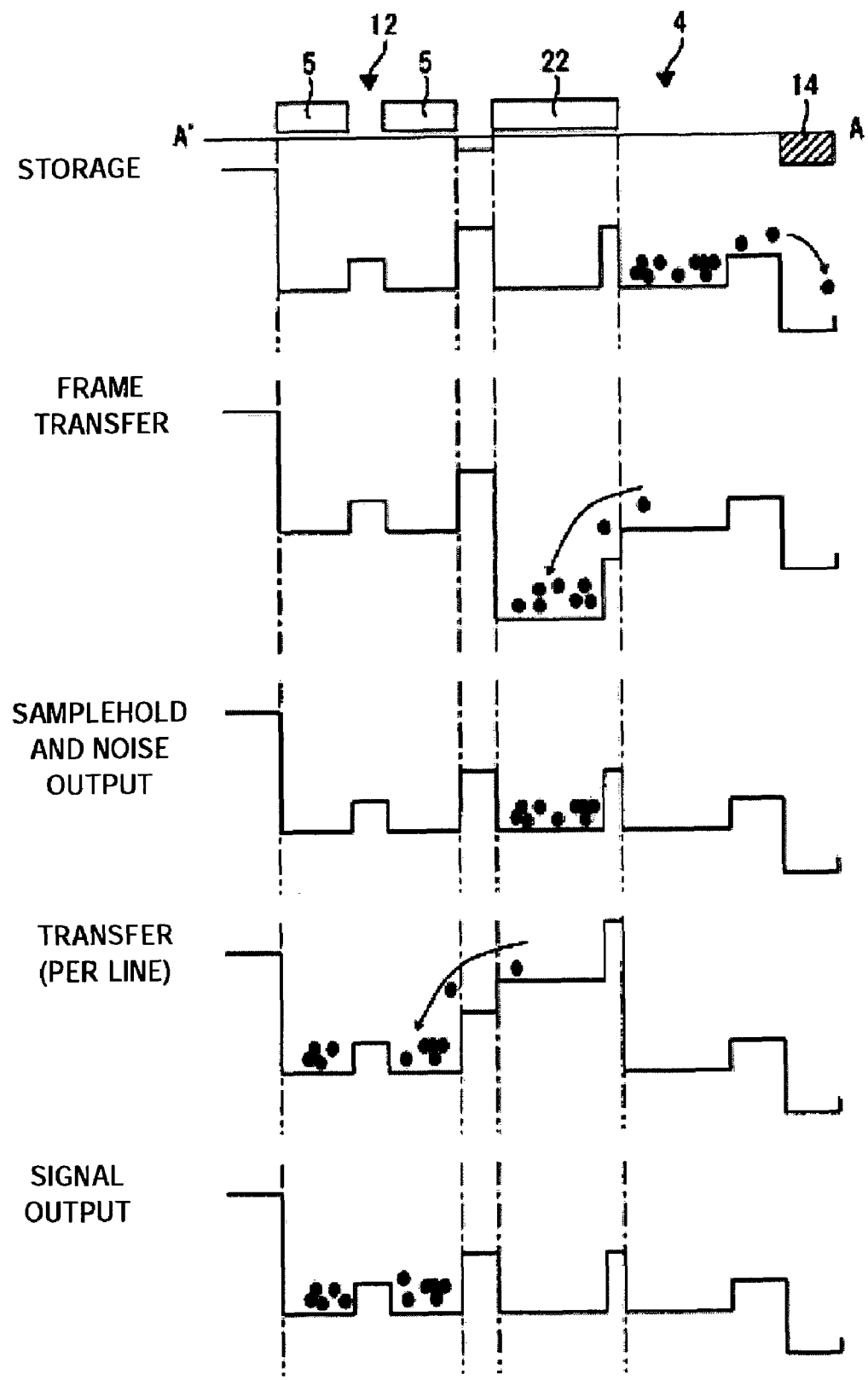
FIG. 4 is a potential diagram in each mode of the solid-state imaging device according to the embodiment of the invention.

FIG. 4 is a potential diagram showing the condition of potential in each mode of the solid-state imaging device. FIG. 4 shows the potentials in, from the top, a storage mode (M1), a batch transfer mode (M2), a retention and noise output mode (M3), a transfer mode (M4), and a signal output mode (M5). In addition, FIG. 4 shows the relation of potentials in the above modes by assuming the direction for higher potential of the positive hole as the positive side.

FIG. 4 shows the relation of potentials in each position by setting the position along the line A-A' in FIG. 1 as the horizontal axis, the same as in FIG. 2, and the potentials with reference to the hole as the vertical axis. In FIG. 4, the potentials in the substrate at the positions of, from left to right, one end of the ring gate 5, the source region 12, the other end of the ring gate 5, the transfer gate 22 of the transfer transistor Tr, the storage well 4, and the OFD region 14 are shown.

In the storage mode (M1), a voltage is applied to the transfer gate 22 of the transfer transistor Tr so that a high potential barrier is formed between the storage well 4 and the carrier pocket 24. The potential of the OFD region 14 is lower than the potential of the transfer gate 22. This is because the electric charge overflowed from the storage well 4 needs to be discharged to the OFD region 14. That is, a storage step is performed for all pixels at a time, for storing the light-generated charge generated by the photoelectric transducer into the storage well 4 by controlling the potential barrier in the transfer path using the gate voltage of the transfer transistor Tr while preventing the light-generated charge from flowing into the carrier pocket 24 at least via the transfer path.

In the batch transfer mode (M2), a specified first voltage that is low enough not to form a potential barrier between the storage well 4 and the carrier pocket 24 is applied to the transfer gate 22 of the transfer transistor Tr. Here, since the potential of the carrier pocket 24 is lower than that of the storage well 4, the electric charge stored in the storage well 4 flows into the carrier pocket 24. That is, a batch transfer step is performed for all pixels at a time, for transferring the light-generated charge stored in the storage well 4 to the carrier pocket 24 by controlling the potential barrier in the transfer path using the gate voltage of the transfer transistor Tr.

In the retention and noise output mode (M3), a voltage is applied to the transfer gate 22 of the transfer transistor Tr so that a high potential barrier is formed between the storage well 4 and the carrier pocket 24. Thus, the electric charge flowed into the carrier pocket 24 is retained within the carrier pocket 24. Further, the reset and read-out of a noise component are performed under the above state, as described later. That is, a noise component modulation step is performed for reading out the noise component of the carrier pocket 7, without flowing the light-generated charge into the carrier pocket 7, by controlling the potential barrier in the transfer path using the gate voltage of the transfer transistor Tr.

In the transfer mode (M4) performed line by line, a specific second voltage that is high enough not to form a potential barrier between the carrier pocket 24 and the modulation well 6 is applied to the transfer gate 22 of the transfer transistor Tr. Here, since the potential of the modulation well 6 is lower than that of the carrier pocket 24, the electric charge stored in the carrier pocket 24 flows into the modulation well 6. That is, a per-line transfer step is performed for transferring the light-generated charge stored in the carrier pocket 24 to the carrier pocket 7 by controlling the potential barrier in the transfer path using the gate voltage of the transfer transistor Tr.

In the signal output mode (M5), a voltage is applied to the transfer gate 22 of the transfer transistor Tr so that a high potential barrier is formed between the carrier pocket 24 and the modulation well 6. Thus, the electric charge flowed into the modulation well 6 is retained within the modulation well 6. Further, the read-out of a signal component is performed under the above state, as described later. That is, a signal component modulation step is performed for outputting a pixel signal from the carrier pocket 7 in accordance with the light-generated charge, while retaining the light-generated charge within the modulation well 6, by controlling the potential barrier in the transfer path using the gate and drain voltages of the transfer transistor Tr.

Next, a driving method that achieves the CDS function and the global electronic shutter function in the solid-state imaging device according to the configuration described above will be described, in accordance with the operation sequence.

Figure 5:
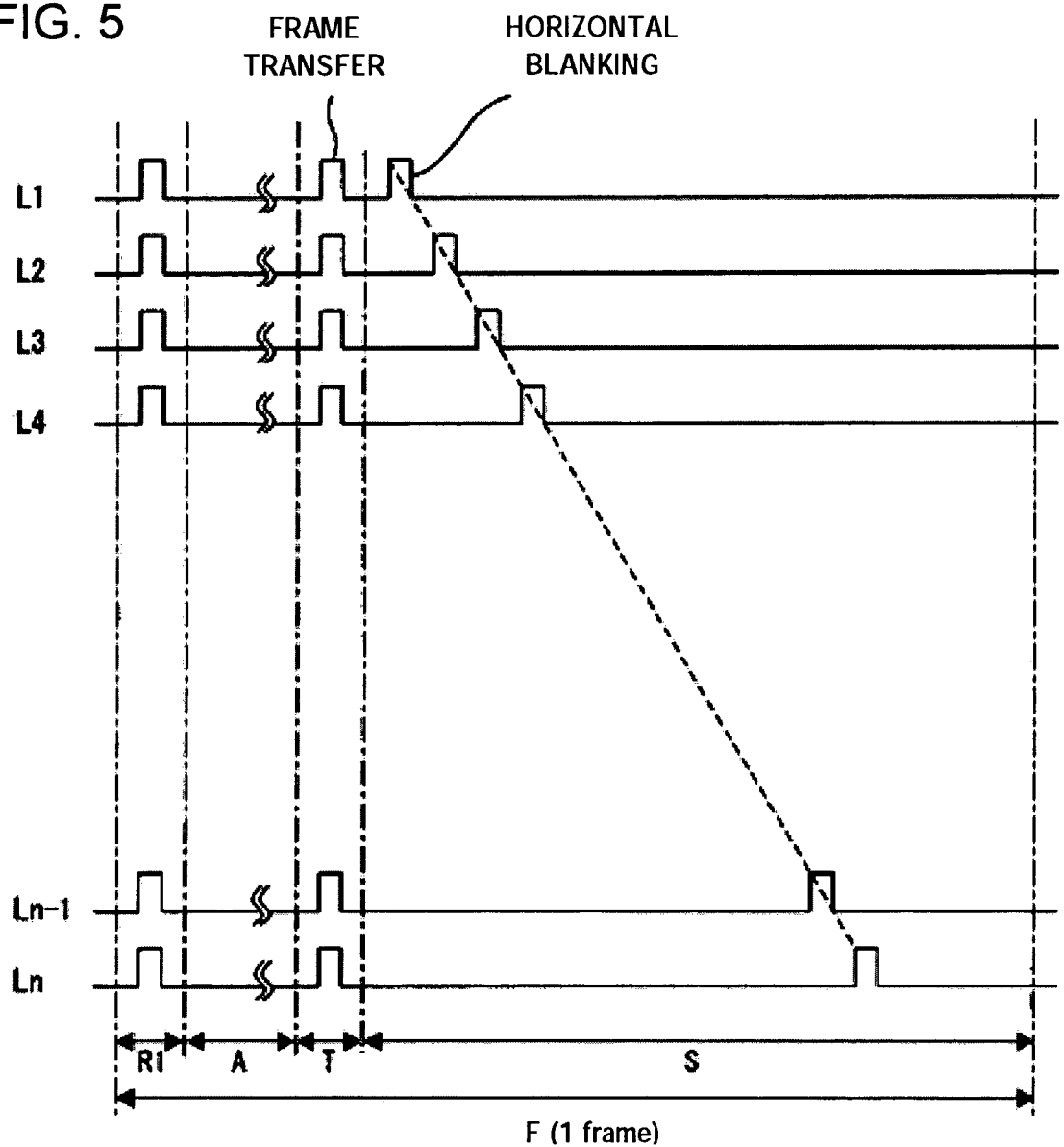
FIG. 5 is a timing chart showing the driving sequence of the solid-state imaging device according to the embodiment of the invention.

FIG. 5 is a timing chart showing the driving sequence of the solid-state imaging device according to the embodiment. As shown in FIG. 5, a single frame period includes four periods: a reset period (R1), a storage period (A), a batch transfer period (T), and a pixel signal read-out period (S).

The reset period (R1) is an all-cell simultaneous reset period for resetting all pixels, that is, all sensor cells at a time at the start of a frame. Further, the resetting operation performed in the reset period (R1) is an operation for discharging the remaining electric charge from the storage well 4, the storage well 23 for transfer use, and the modulation well 6 of all pixels. After the resetting operation, storing of electric charge into the storage well 4 of each sensor cell is started.

The storage period (A) following the reset period (R1) is a period when each sensor cell turns to the storage mode (M1) for storing the light-generated charge, generated in the photodiode-forming region PD at the receipt of light, into the storage well 4.

The batch transfer period (T) following the storage period (A) is a period when each sensor cell turns to the batch transfer mode (M2) for transferring the electric charge stored in each photodiode-forming region PD to the carrier pocket region TCP of each sensor cell for all pixels, that is, all sensor cells at a time. The batch transfer operation in the batch transfer period (T) is performed by applying a specified first voltage to the transfer gate 22 of the transfer transistor Tr at a time.

Following the batch transfer mode (M2), the operation mode turns to a state for retaining the electric charge within the carrier pocket region TCP, that is, the retention and noise output mode (M3).

As shown in FIG. 5, the pixel signal read-out period (S) following the batch transfer period (T) includes horizontal blanking periods (H) for transferring the electric charge retained in the carrier pocket region TCP to the modulation transistor-forming region TM for each selected line. That is, as shown in FIG. 5, in the pixel signal read-out period (S), the horizontal blanking periods (H) occur sequentially, in other words, consecutively with time lags for n lines, starting from a first line L1 to a last line Ln. The horizontal blanking period (H) includes a reset period (R2) and a noise and signal components read-out period (SS), as shown in FIG. 6.

Figure 6:
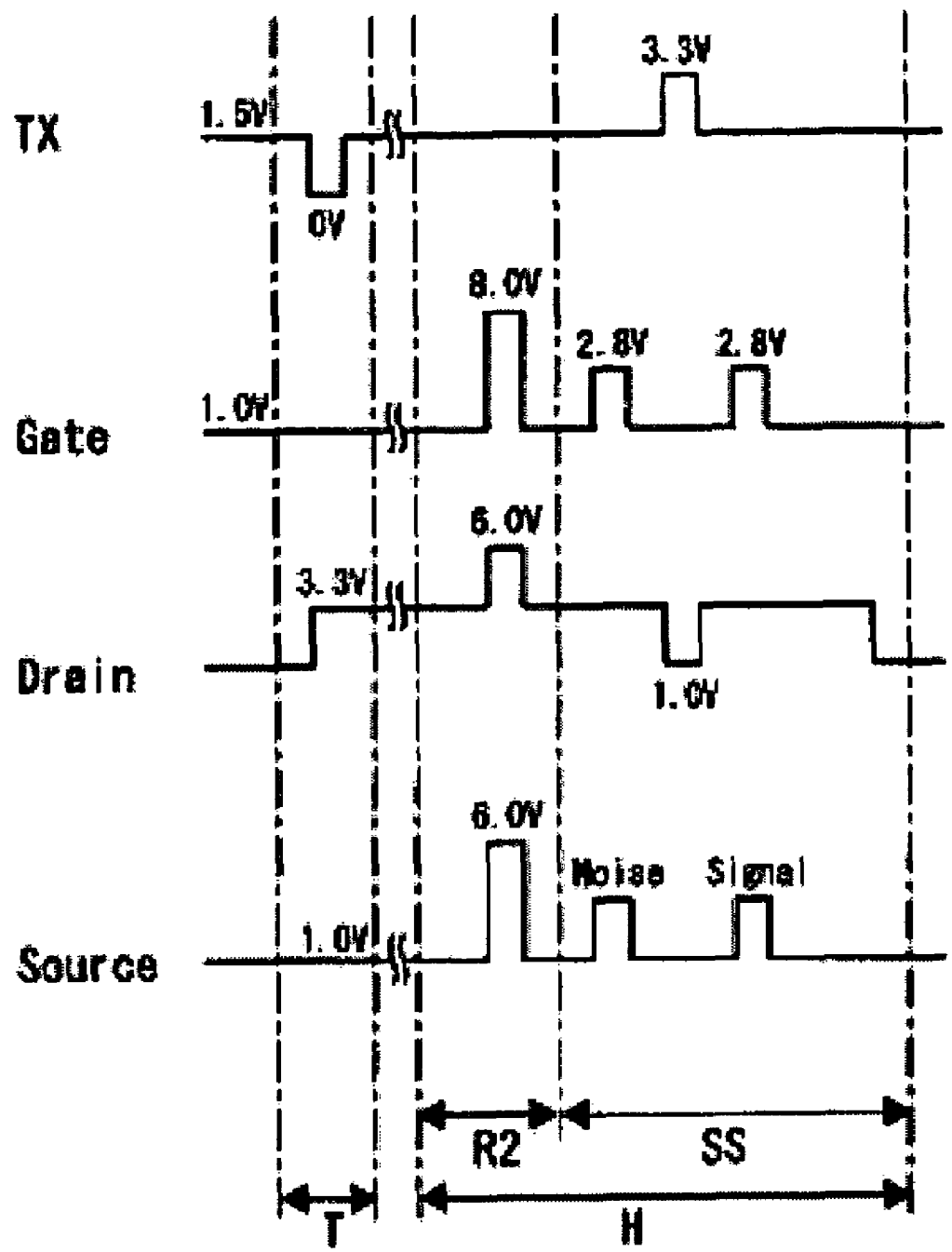
FIG. 6 is another timing chart for describing a horizontal blanking period according to the embodiment of the invention.

FIG. 6 is another timing chart for describing the batch transfer period (T) and the horizontal blanking period (H). The horizontal blanking period (H) occurs every selected line. FIG. 6 shows the voltage waveforms that are applied to: the transfer gate 22 of the transistor Tr; and the gate 5, source 12, and drain 13 of the modulation transistor Tm during the batch transfer period (T) and the horizontal blanking period (H).

In the batch transfer period (T), the voltage of the transfer gate 22 changes from 1.5 V to 0 V; the voltage of the gate 5 is 1.0 V; the voltage of the drain 13 changes from 1.0 V to 3.3 V; and the voltage of the source 12 is 1.0 V.

In the reset period (R2), the voltage of the transfer gate 22 becomes 3.3 V; the voltage of the gate 5 changes from 1.0 V to 8.0 V; the voltage of the drain 13 changes from 3.3 V to 6.0 V; and the voltage of the source 12 changes from 1.0 V to 6.0 V. With the resetting operation during the reset period (R2), the electric charge within the carrier pocket 7 is discharged.

In the noise and signal components read-out period (SS), for the first purpose of reading out the noise component, the voltage of the transfer gate 22 becomes 1.5 V; the voltage of the gate 5 changes from 1.0 V to 2.8 V; the voltage of the drain 13 becomes 3.3 V; and the voltage of the noise component is outputted to the source line S (M3). Then, the voltage of the transfer gate 22 changes from 1.5 V to 3.3 V; the voltage of the gate 5 becomes 1.0 V; the voltage of the drain 13 changes from 3.3 V to 0 V; and the voltage of the source 12 becomes 1.0 V. Thus, the electric charge transfer from the carrier pocket 24 to the carrier pocket 7 is performed (M4).

Next, for the purpose of reading out the signal component, the voltage of the transfer gate 22 becomes 1.5 V; the voltage of the gate 5 changes from 1.0 V to 2.8 V; the voltage of the drain 13 becomes 3.3 V; and the voltage of the signal component is outputted to the source line S. Thus, a signal component is read out based on the amount of electric charge within the carrier pocket 7 (M5).

After the above operations, the voltage of the transfer gate 22 becomes 1.5 V; the voltage of the gate 5 becomes 1.0 V; the voltage of the drain 13 becomes 3.3 V; and the voltage of the source 12 becomes 1.0 V.

As described above, with the solid-state imaging device according to the embodiment, wherein power consumption can be lowered in each mode by controlling not only the voltage of the transfer gate 22 but also the voltages of the gate and drain of the modulation transistor Ts in the modulation transistor-forming region TM, both the global electronic shutter function for transferring, for all pixels at a time, electric charge after storing at the receipt of light and the CDS function based on the advance reading of noises can be achieved simultaneously.

Consequently, with the solid-state imaging device according to the embodiment, image signals of a high image quality can be obtained.

Further, in the solid-state imaging device according to the embodiment, unlike the case of the solid-state imaging device according to the third related art example, electric charge is not transferred by using only potential profiles. Therefore, the process for manufacturing semiconductors becomes relatively easy.

The invention is not limited to the above embodiment but can be modified variously within the scope of the invention.

What is claimed is:

1. A solid-state imaging device, comprising:
    a plurality of unit pixels, each of which including:
        a storage well for storing electric charges generated by a photoelectric transducer in accordance with incident light;
        a transferring unit for transferring the electric charges to a floating diffusion region, the transferring unit including a transferring control element, the transferring control element having a transfer gate and an electric charge-retaining region for retaining the electric charge, the transfer gate being disposed on a substrate with insulation film therebetween, a part of the transfer gate overlapping the storage well as viewed in plan, the electric charge-retaining region provided within the substrate and under the transfer gate;
        an amplifier for outputting a pixel signal that is amplified based on the electric charge transferred to the floating diffusion region, a first diffusion layer that serves as a transfer path between the floating diffusion region and the electric charge-retaining region; and a second diffusion layer formed over the first diffusion layer.

2. The solid-state imaging device according to claim 1, further comprising a discharging unit for discharging an excess of the electric charge in the storage well.

3. The solid-state imaging device according to claim 1, wherein the amplifier includes a modulation transistor that outputs the pixel signal in accordance with the electric charge by controlling a threshold voltage of a channel using the electric charge retained in the floating diffusion region.

4. A method for driving a solid-state imaging device, comprising the steps of:

a storage step for storing, for all of a plurality of unit pixels included in the solid-state imaging device at a time, light-generated charge generated by a photoelectric transducer into a storage well by controlling a potential barrier in a transfer path using a transfer control element while preventing the light-generated charge from flowing into an electric charge-retaining region at least via the transfer path;

a first transfer step for transferring, for all of the plurality of unit pixels at a time, the light-generated charge stored in the storage well to the electric charge-retaining region by controlling the potential barrier in the transfer path using the transfer control element;

a noise component modulation step for reading out a noise component of a floating diffusion region, without flowing the light-generated charge into the floating diffusion region, by controlling the potential barrier in the transfer path using the transfer control element;

a second transfer step for transferring the light-generated charge stored in the electric charge-retaining region to the floating diffusion region by controlling the potential barrier in the transfer path using the transfer control element; and a signal component modulation step for outputting a pixel signal from the floating diffusion region in accordance with the light-generated charge while retaining the light-generated charge within a modulation well, by controlling the potential barrier in the transfer path using the transfer control element, wherein each of the plurality of unit pixels includes: the storage well for storing the light-generated charge generated by the photoelectric transducer in accordance with incident light; the floating diffusion region to which the light-generated charge is transferred; an amplifier for outputting the pixel signal that is amplified based on the light-generated charge transferred to the floating diffusion region; and the transfer control element that controls the potential barrier in the transfer path between the storage well and the floating diffusion region and has the electric charge-retaining region for retaining the light-generated charge.

5. A solid-state imaging device, comprising:

a photoelectric transducer for generating an electric charge in accordance with an incident light, the photoelectric transducer including a first diffusion portion and a second diffusion portion, the first diffusion portion having a first conductive type and the second diffusion portion having a second conductive type;

an amplifier for outputting a pixel signal that is amplified based on an electric charge, the amplifier including a third diffusion portion and a fourth diffusion portion, the third diffusion portion having the first conductive type and the fourth diffusion portion having the second conductive type; and a transferring unit for transferring an electric charge from the photoelectric transducer to the amplifier, the transferring unit including a transfer gate, a fifth diffusion portion and a sixth diffusion portion, the fifth diffusion portion having the first conductive type and the sixth diffusion portion having the second conductive type, the transferring unit being configured to transfer an electric charge from first diffusion portion to the fifth diffusion portion via the sixth diffusion portion and to transfer an electric charge from the fifth diffusion portion to the fourth diffusion portion via the third diffusion portion.

6. The solid-state imaging device according to claim 5, further comprising:

a discharge unit for discharging an electric charge from the storage well, the discharge unit including a seventh diffusion portion having the first conductive type.

7. The solid-state imaging device according to claim 5, the transferring unit including a modulation transistor that outputs the pixel signal in accordance with an electric charge by controlling a threshold voltage of a channel using an electric charge retained in the third diffusion portion.

8. The solid-state imaging device according to claim 7, the modulation transistor having a ring gate.

9. The solid-state imaging device according to claim 8, the modulation transistor having a first carrier pocket in the third diffusion portion overlapping with the ring gate, the first carrier pocket having the first conductive type and being doped highly than the third diffusion portion.

10. The solid-state imaging device according to claim 7, the fourth diffusion portion being a source of the modulation transistor.

11. The solid-state imaging device according to claim 5, the transferring unit having a second carrier pocket in the fifth diffusion portion overlapping with the transfer gate, the second carrier pocket having the first conductive type and being doped highly than the fifth diffusion portion.

12. The solid-state imaging device according to claim 5, the second diffusion portion and the sixth diffusion portion contacting each other and composing a second conductive type layer.

13. The solid-state imaging device according to claim 5, the third diffusion portion and the fifth diffusion portion contacting via a eighth diffusion portion having the first conductive type.

14. The solid-state imaging device according to claim 5, the transferring unit including a modulation transistor that outputs the pixel signal in accordance with an electric charge by controlling a threshold voltage of a channel using an electric charge retained in the third diffusion portion, the modulation transistor having a ring gate, the modulation transistor having a first carrier pocket in the third diffusion portion overlapping with the ring gate, the first carrier pocket having the first conductive type and being doped highly than the third diffusion portion, the transferring unit having a second carrier pocket in the fifth diffusion portion overlapping with the transfer gate, the second carrier pocket having the first conductive type and being doped highly than the fifth diffusion portion.

* * * * *

UNITED STATES PATENT AND TRADEMARK OFFICE
CERTIFICATE OF CORRECTION

PATENT NO. : 7,488,997 B2 Page 1 of 1
APPLICATION NO. : 11/181586
DATED : February 10, 2009
INVENTOR(S) : Kazunobu Kuwazawa It is certified that error appears in the above-identified patent and that said Letters Patent is hereby corrected as shown below:

Title Page, item (56) FOREIGN PATENT DOCUMENTS:
Insert the following:
--JP    58-050874    3/1983
  JP    2000-150853    5/2000
  JP    2002-064751    2/2002--

Column 4, Line 61: "has" should be --have--

Column 10, Line 63, Claim 1, "plan" should be --plan view,--

Column 12, Line 48, Claim 13: "a" should be --an--

Signed and Sealed this

Twenty-first Day of April, 2009

JOHN DOLL
*Acting Director of the United States Patent and Trademark Office*